United States Patent
Maveety et al.

(10) Patent No.: US 6,785,134 B2
(45) Date of Patent: Aug. 31, 2004

(54) EMBEDDED LIQUID PUMP AND MICROCHANNEL COOLING SYSTEM

(75) Inventors: James G. Maveety, San Jose, CA (US); Gregory M. Chrysler, Chandler, AZ (US); Michael C. Garner, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/337,955

(22) Filed: Jan. 6, 2003

(65) Prior Publication Data

US 2004/0130874 A1 Jul. 8, 2004

(51) Int. Cl.[7] .................................................. H05K 7/20
(52) U.S. Cl. ....................... 361/699; 361/689; 361/698; 361/700; 257/714; 257/715; 165/80.4
(58) Field of Search ................................ 361/695, 700, 361/719–721; 174/15.1, 15.2; 257/714, 715; 165/80.4

(56) References Cited

U.S. PATENT DOCUMENTS

| | | | | |
|---|---|---|---|---|
| 5,057,908 A | * | 10/1991 | Weber | 257/714 |
| 5,529,465 A | * | 6/1996 | Zengerle et al. | 417/413.2 |
| 6,186,660 B1 | * | 2/2001 | Kopf-Sill et al. | 366/340 |
| 6,501,654 B2 | * | 12/2002 | O'Connor et al. | 361/699 |
| 6,521,516 B2 | * | 2/2003 | Monzon et al. | 438/514 |
| 6,529,377 B1 | * | 3/2003 | Nelson et al. | 361/699 |
| 6,591,625 B1 | * | 7/2003 | Simon | 62/259.2 |

OTHER PUBLICATIONS

Zuo, Jon; US patent application Publication, US 2003/0151895; Aug. 14, 2003.*
Goodson et al., "Electrokinetically–Pumped Two–Phase Heat Exchangers", (Web Document) http://www.stanford.edu/group/microheat/hex.html.*

* cited by examiner

Primary Examiner—Boris Chervinsky
(74) Attorney, Agent, or Firm—Schwabe, Williamson & Wyatt, P.C.

(57) ABSTRACT

Apparatus and methods in accordance with the present invention provide self-contained, closed-loop microchannel/electrokinetic pump cooling systems that can be integrated into the microelectronic die and the integrated heat sink to provide microelectronic die cooling. Microchannel/electrokinetic pump cooling systems utilize active cooling technology to reduce thermal gradients and operating temperature of a microelectronic die. This system disclosed here will enhance heat dissipation and provide immediate cooling of localized hot spots within the microelectronic die. This will have the effect of reducing the microelectronic die temperature or spreading the heat internally within the microelectronic die depending on the layout of the microchannels.

16 Claims, 3 Drawing Sheets

EMBEDDED LIQUID PUMP AND MICROCHANNEL COOLING SYSTEM

FIELD OF THE INVENTION

The present invention relates to thermal management of microelectronic packaging and dice, and, more particularly, to active cooling using electrokinetic fluid pumping and internal cooling microchannels.

BACKGROUND OF INVENTION

A microelectronic package comprises a microelectronic die electrically interconnected with a carrier substrate, and one or more other components, such as electrical interconnects, an integrated heat spreader, a heat sink, among others. An example of a microelectronic package is an integrated circuit microprocessor. A microelectronic die comprises a plurality of interconnected microcircuits within a carrier to perform electronic circuit functions.

A microelectronic die generates heat as a result of the electrical activity of the microcircuits. In order to minimize the damaging effects of heat, passive and active thermal management devices are used. Such thermal management devices include heat sinks, heat spreaders, and fans, among many others. There are limitations in the use of each type of device, and in many cases, the thermal management device is specifically designed for a particular microelectronic die and package design and intended operation.

Heat sinks are one type of passive thermal management device. The heat sink provides the transfer of heat from the surface of the microelectronic die to a large thermal mass, which itself incorporates a large surface area to convectively transfer the heat to the surrounding environment. Effective heat sinks tend to be very large and have sophisticated design with regards to fins and or pin heat releasing appendages.

Integrated heat spreaders (IHS) are passive thermal conducting lids or caps placed in intimate thermal contact with the backside surface of the microelectronic die. Integrated heat spreaders also have sides that extend to seal against the carrier substrate, containing and protecting the microelectronic die and the electrical interconnects from the environment. An integrated heat spreader also provides an enlarged flat surface into which a heat sink may be attached.

Non-uniform power distribution across the microelectronic die results in local areas of high heat flux (hot spots) that must be mitigated. The thermal management device must be able to maintain these hot spots at or below a specified temperature. This is very difficult when the local heat can be 10-times the microelectronic die average. Current devices are overwhelmed and limited in their ability to mitigate these local high heat flux sources. The thermal resistance between the heat sink and/or heat spreader is not low enough to adequately provide the necessary thermal mitigation in a reasonably sized system.

Currently, the localized heat generation is dissipated away from the microelectronic die once the heat has diffused to the surface. An IHS, heat sink, and/or a fan coupled to the surface does not have a major effect on spreading heat at the local-level within the microelectronic die. As a result, high temperature gradients and high-localized temperatures will continue to exist using the external methods of cooling.

Apparatus and methods are needed to mitigate the effects of non-uniform power distribution and for providing means of removing of dissipating the the required heat flux distribution across the microelectronic die. They must provide for exceptionally small-scale integration, not interfere with the electrical interface of other components within the microelectronic package, and be inexpensive to manufacture.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Apparatus and methods in accordance with embodiments of the present invention utilize active cooling technology to reduce thermal gradients and operating temperature of a microelectronic die. An electrokinetic (EK) pump in conjunction with microchannels provide a microthermofludic device for thermal management of microelectronic packages.

Three embodiments of cooling systems in accordance with the present invention are provided below. It is understood that these are provided as examples of various embodiments for practicing the present invention, but are not intended to limit the present invention thereto. Embodiments of a cooling system comprising a electrokinetic pump supplying cooling fluid to a microelectronic package, in accordance with the present invention, include: microchannels formed within the microelectronic die; microchannels formed on the inside surface of an integrated heat spreader (IHS), wherein one wall of the microchannels is the backside of the microelectronic die; and microchannels formed within a separate structure coupled to the backside of the microelectronic die.

Figure 1:
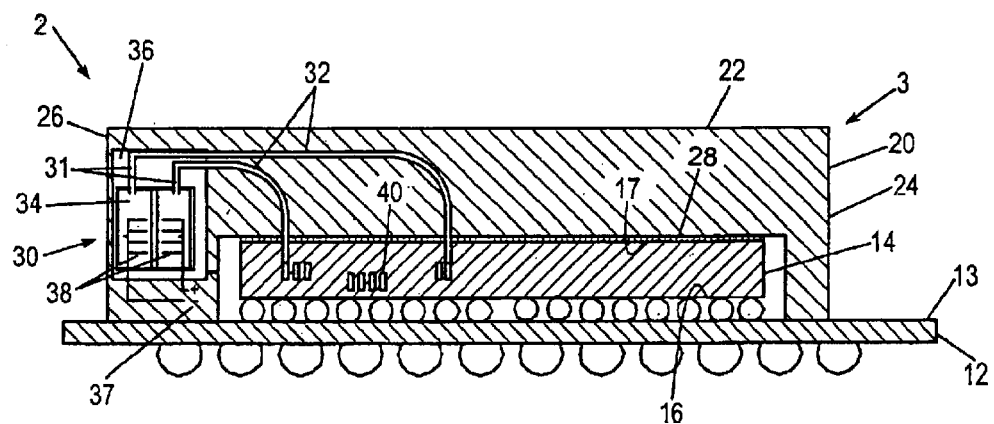
FIG. 1 is a cross-sectional view of an embodiment of a cooling system within a microelectronic package, in accordance with the present invention.

FIG. 1 is a cross-sectional view of an embodiment of a cooling system 2 within a microelectronic package 3, comprising embedded die microchannels 40 within a microelectronic die 14 with cooling fluid (not shown) supplied by an EK pump 30, in accordance with the present invention. The microelectronic package 3 comprises a microelectronic die 14 (illustrated as a flip-chip, but not limited thereto) electrically interconnected with a carrier substrate 12 adjacent a carrier substrate top surface 13. The microelectronic die 14 is thermally coupled with an IHS 20.

The microelectronic die 14 comprises one or more die microchannels 40. The die microchannels 40 are adapted to permit the flow of cooling fluid there-through. The die microchannels 10 are located strategically about the localized hot spots within the microelectronic die 20, such as, but not limited to, the floating-point area. Though microchannels can be various sizes, in an embodiment in accordance with the present invention, the microchannels have a dimension on the order of 50 to 100 um.

The one or more die microchannels 40 are formed by techniques used in the semiconductor art, including but not limited to, photolithographic/wet etch and micro-machining techniques. For example, but not limited thereto, a semiconductor substrate, such as, but not limited to, silicon wafer, is provided with die microchannels 40 by using a photolithographic technique using a mask to expose areas of the die to be etched away that will ultimately form the die microchannels 40. A subsequent lamination or layer of material is used to seal the die microchannels 40.

The die microchannels 40 are located within the microelectronic die 14 to reduce the peak temperature of the microelectronic die 14, reduce the temperature gradient across the microelectronic die 14, and allow for the die microchannels 40 to be incorporated into the circuit design for specific applications. The specific arrangement of the die microchannels 40 will determine the distribution of heat transport along the microelectronic die 14.

Figure 2:
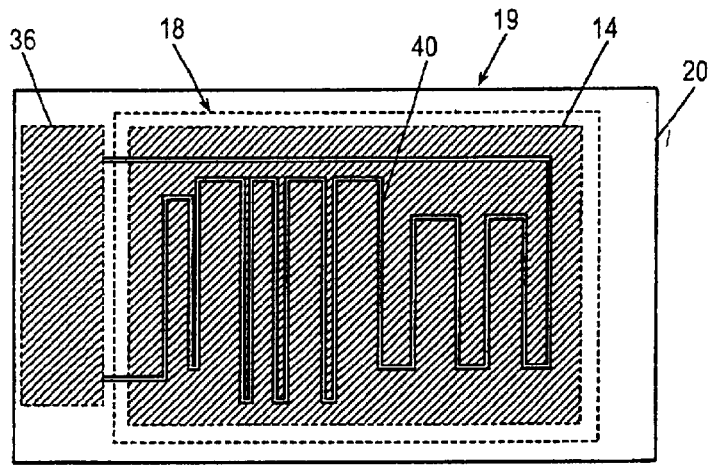
FIG. 2 is a top view illustrating the location of the embedded die microchannels and accompanying EK pump in accordance with the embodiment of FIG. 1.

FIG. 2 is a top view illustrating the location of the embedded die microchannels 40 and accompanying EK pump 30 in accordance with the embodiment of FIG. 1. The die microchannels 40 are formed in a pattern so as to draw heat from the high heat flux area(s) 18 and deposit it at the low heat flux area(s) 9. For example, an area on the microelectronic die 14 comprising high power density floating point circuits is a high heat flux area 18, whereas the area comprising low power density cache memory circuits is a low heat flux area 19. The die microchannels 40 are patterned with respect to the circuit design to result in a microelectronic die 14 having a more uniform temperature gradient.

The microelectronic die 14 is patterned with varying densities of die microchannels 40; a higher density in the higher heat flux area 18 and a lower density in the lower heat flux area 19. The die microchannels 40 are also varied in elevation to the active surface 16 of the microelectronic die 14 in accordance to a predetermined thermal requirement. The die microchannels 40 may also be connected in parallel or serial.

The integrated heat spreader (IHS) 20 comprises a top portion 22 and side portions 24. The top portion 22 comprises an inside surface 28 adapted for thermal coupling with the backside 17 of the microelectronic die 14. The side portions 24 are adapted to extend from the top portion 22 to the top side 13 of the carrier substrate 12 and coupled thereto.

An electrokinetic (EK) pump 30 is incorporated into the IHS 20. A cavity 36 is provided in a cavity side 26 of the IHS 20, which is a side portion 24 that is enlarged as needed to house the EK pump 30. In an embodiment for an IHS 20 of a common size, a side portion 24 is extended in the lateral dimension by 5 mm, providing a volume on the order of 20 mm (L)×5 mm (W)×2 mm (H) to house the EK pump 30.

The fluid reservoirs 34 of the EK pump 30 can be a separate component from the IHS 24 or integral with the IHS 24. The fluid requirements of the EK pump 30 is very small and can be contained in a containment capsule that is housed in the cavity 36 and coupled to the die microchannels 40 with inlet/outlet lines 31. In another embodiment in accordance with the invention, fluid reservoirs 35 are formed as an integral part of the IHS 20. Micromachined supply microchannels 32 are provided in the IHS 20 to provide the liquid flow path to and from the reservoirs 34 and the microelectronic die 14.

Figure 3A:
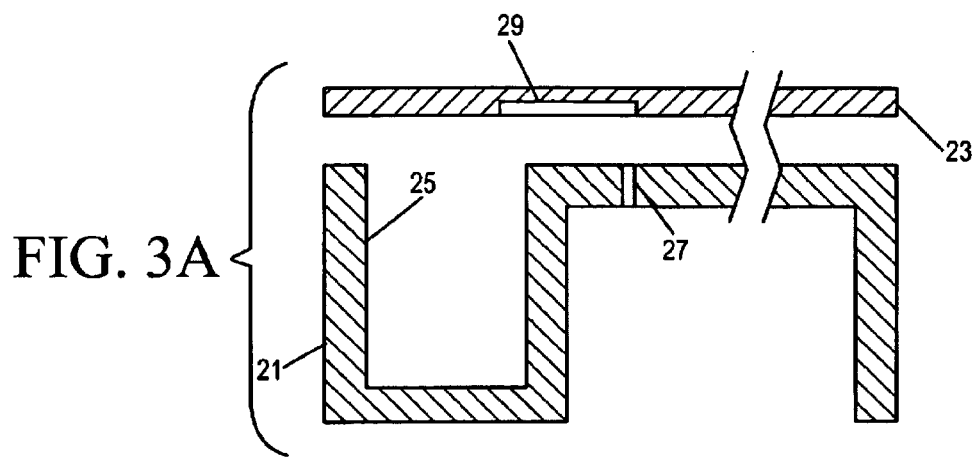
FIGS. 3A and 3B are side cross-sectional views of components of an IHS before and after diffusion bonding, in accordance with a method of the present invention.

The cavity 36, or the integral fluid reservoirs 35, may be formed within the IHS 20 in a number of ways. FIG. 3A is a side cross-sectional view of components of an IHS 20 in accordance with a method of the present invention. The IHS 20 is fabricated from a bottom part 21 and a top part 23. The bottom part 21 is machined to include one or more cavity portions 25 and one or more descending channels 27. The top part 23 is machined with one or more horizontal channels 29.

Figure 3B:
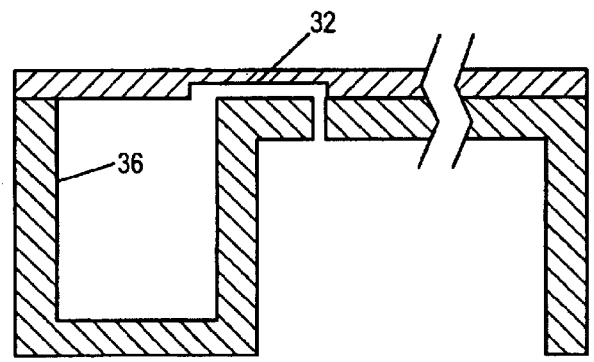

FIG. 3B is a cross-sectional view of the bottom part 21 and top part 23 after a diffusion bonding process is completed using temperature and pressure to consolidate the parts. The diffusion bonded bottom part 21 and top part 23 form the cavity 36, or the integral fluid reservoirs 35, and integral supply/return channels 32. Diffusion bonding is a known process and can be used with a variety of materials, including metals and semiconductor materials.

The EK pump 30 has no moving parts. A pressure differential, and therefore fluid flow, is produced as a byproduct of a chemical reaction resulting from the dissociation of the cooling fluid (electrolysis) caused by a voltage across two electrodes. The reservoirs comprise electrodes 38 interconnected with a voltage source 37 in order to operate the EK pump 30. When a voltage is applied, the EK pump 30 drives working fluid from the reservoir to the die microchannels 40 in the microelectronic die 14 such as, but not limited to, using the phenomena known as electroosmosis. Support for this inclusion is found in the art, as the nomenclature for electrokinetic phenomena is in a state of developement.

A number of cooling fluids may be used as the working fluid, including, but not limited to, deionized (DI) water. Because of its relatively low ionic conductivity, DI water ($10^{-3}$ S/m) is chosen as working fluid to maintain a moderate thermodynamic efficiency.

The cooling system 2 can be operated in either a single phase/liquid or two-phase liquid/gas mode. The best mode is dependent on microelectronic package 3 conditions, such as the magnitude of local heat flux and target operating temperature. The portion of the cooling process wherein the fluid is absorbing heat is referred to as the evaporation portion. The portion of the cooling process wherein the fluid is giving off heat to the cooler areas is referred to as the condensing portion. The heat absorbed by the fluid will be dissipated throughout the microelectronic die 14. This will provide a more uniform distribution of heat over the entire backside 17, which will make the dissipation of the heat to the IHS 20 very effective.

Electrokinetic (EK) pumps 30 can generate pressures in excess of 10 and even 100 atm. The pressure capacity of EK pumps 30 far exceeds the capacity of other micropumps, which have a limit of 1 atm. The EK pump 30 has the advantage of being compatible with aqueous solutions as working fluid.

Figure 4:
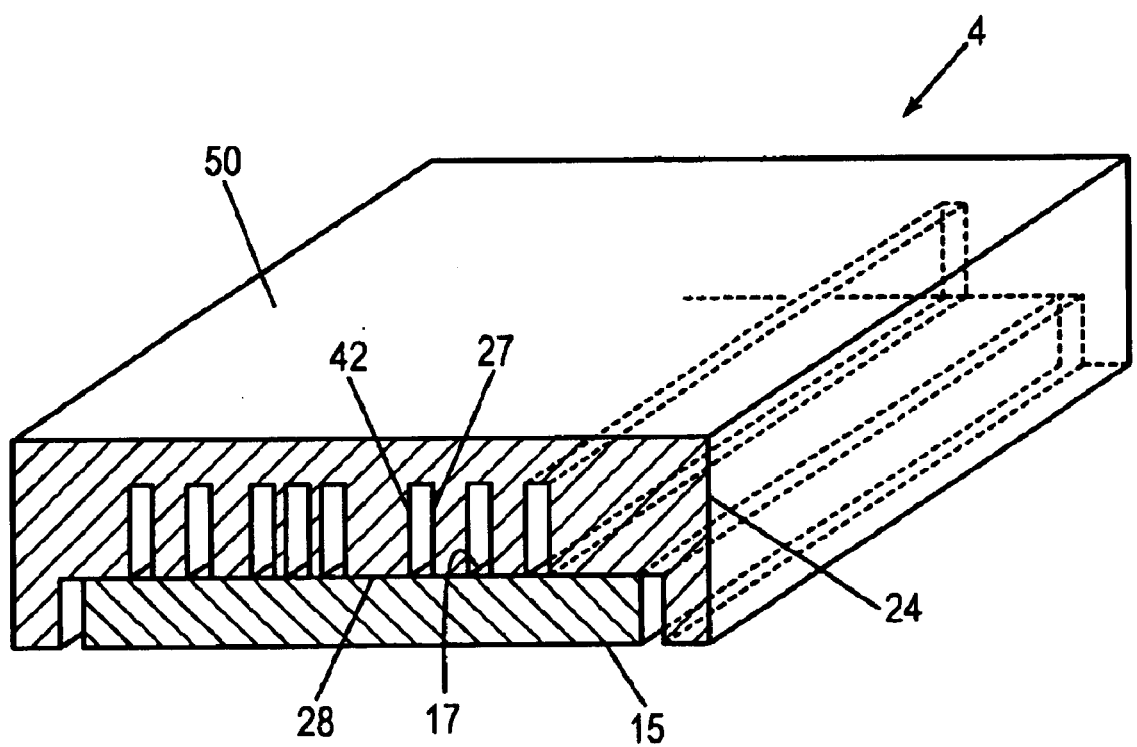
FIG. 4 is a cross-sectional view of an IHS comprising partially formed backside microchannels formed into the IHS inside surface, in accordance with an embodiment of present invention.

FIG. 4 is a cross-sectional view of an IHS 50 comprising IHS grooves 27 formed into the IHS inside surface 28, in accordance with an embodiment of present invention. Backside microchannels 42 are formed when the IHS inside surface 28, comprising IHS grooves 27, is placed in contact with and bonded to the backside 17 of the microelectronic die 15.

Heat from the microelectronic die 15 will be conducted to the backside 17 where is will be absorbed by the cooling fluid. The EK pump 30 will pump the heated fluid to cooler areas of the IHS 50 and into the environment in contact with the IHS 50, such as an attached heat sink (not shown).

Since the IHS grooves 27 are formed only within the IHS 50, no additional modification to the finished microelectronic die 15 is required. In this configuration, the microelectronic die 15 simply provides the fourth wall of the backside microchannels 42.

As with the first embodiment, the cooling process starts with fluid being pumped from the EK pump (not shown), through supply microchannels (not shown) in the IHS 50 to the backside microchannels 42.

The IHS grooves 27 are fabricated by but not limited to, stamping, coining, machining, and/or etching on inside surface 28 of the IHS 50. Once the inside surface 28 is assembled over the backside 17 of the microelectronic die 15, the backside microchannels 42 are sealed by the backside 17 of the microelectronic die 15, using a suitable process, such as diffusion bonding. Backside microchannel 42 dimensions may be larger than die microchannels 40, but the cooling process is identical, and choice of single phase or two-phase cooling remains an option.

In another embodiment in accordance with the present invention, backside microchannels are formed from grooves formed in the backside of the microelectronic die rather than the IHS with similar results.

Figure 5:
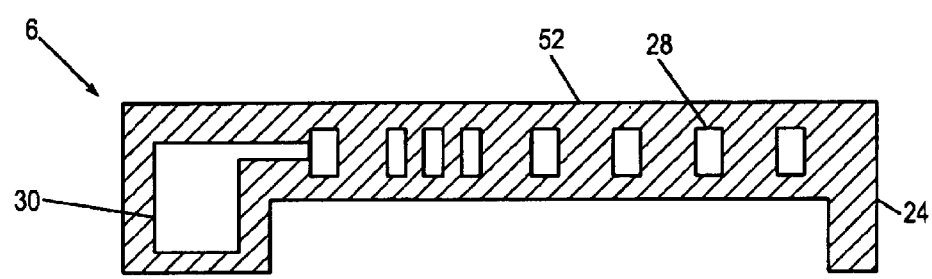
FIG. 5 is a cross-sectional view of an IHS comprising a self contained cooling system of IHS microchannels and an EK pump, in accordance with an embodiment of present invention.

FIG. 5 is a cross-sectional view of an IHS 52 comprising a self contained cooling system 6 of IHS microchannels 46 and an EK pump 30, in accordance with an embodiment of present invention. Operating principles are the same as discussed above. Since the microchannels 46 are not as close to the high heat flux circuitry, the thermal uniformity of the microelectronic die will not be as complete as with the other mentioned embodiments. Benefits could prove significant to warrant the use of embodiments of this type.

In other similar embodiments, either the microchannels or the entire self contained cooling system is contained in other devices, including, but not limited to, a flat heat spreader and a heat sink. Embodiments having self-contained microchannel/EK pumps can be used to retrofit pre-existing devices, or devices of a predetermined standard size.

In yet another embodiment in accordance with the present invention, microchannels are provided on a separate substrate comprising the same material as the microelectronic die. In other embodiments in accordance with the present invention, the separate substrate is not the same material as the microelectronic die. The separate substrate is attached or bonded to the backside of the microelectronic die. This embodiment provides that ability to couple the separate substrate to the microelectronic die after both have passed some functional tests to ensure they both work. This embodiment also provides the ability to process the substrate separate from the microelectronic die in device specific processes without compromising the quality of the other.

With separate substrate and microelectronic die, the ability to bond the two in a strong, void-free bond is important. Methods for Silicon (Si) to Si bonding with void-free bonds and bond strengths approaching a monolithic piece of Si are known in the art. Silicon to silicon bonding is practiced commercially with several companies supplying bonding equipment. One process involves cleaning the two silicon surfaces with $H2SO4+H2O2$ or $NH4OH+H2O2+H2O$, optionally applying a surface activation agent, TEOS or NaSi, and pressing together and heating to a moderate temperature of about 200–400 C. There are also known methods for bonding $Si4N3$ coated substrate and bonding substrate with Au—Si solder. Regardless of the process, the result should be a hybrid substrate consisting of a microelectronic die with a stacked microchanneled substrate, but without a measurable bond resistance between the two.

The microchannel cooling with the self-contained liquid EK pumping system in embodiments in accordance with the present invention disclosed herein will enhance heat dissipation and provide immediate cooling of localized hot spots within the microelectronic die. This will have the effect of reducing the microelectronic die temperature and/or spreading the heat internally within the microelectronic die depending on the layout of the microchannels. The benefits of reducing thermal gradients and lowering average microelectronic die operating temperature, include: reduction of thermal stresses that are a significant reliability issue and enhanced microelectronic die electrical performance.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
   a substrate comprising an integrated heat spreader including microchannels in fluid communication with an electrokinetic pump housed within the integrated heat spreader,
   the electrokinetic pump including
      a fluid;
      a reservoir, formed integral with the integrated heat spreader, in fluid communication with the microchannels; and
      a plurality of electrodes adapted to provide a pressure differential by electrolysis of the fluid; and
   a microelectronic die including internal die microchannels, the die microchannels in fluid communication with the microchannels within the integrated heat spreader.

2. A method for actively cooling a microelectronic die, comprising:
   providing a substrate comprising an integrated heat spreader including substrate microchannels in fluid communication with an electrokinetic pump housed within the integrated heat spreader,
   the electrokinetic pump including a fluid; a reservoir, formed integral with the integrated heat spreader, in fluid communication with the substrate microchannels; and a plurality of electrodes;
   providing the plurality of electrodes with a voltage sufficient to electrolyze the fluid to drive the fluid through the substrate microchannels by a pressure differential caused by electrolysis of the fluid; and forming internal die microchannels within the microelectronic die, the die microchannels in fluid communication with the substrate microchannels.

3. An apparatus comprising:

a microelectronic die including a high heat flux area and internal die microchannels;

a fluid disposed within the die microchannels, to at least facilitate heat transfer away from the high heat flux areas;

and a substrate including microchannels in fluid communication with the internal die microchannels.

4. The apparatus of claim 3, wherein the internal die microchannels exhibit increased spacing density in the high heat flux area.

5. The apparatus of claim 3, wherein the fluid at least facilitates heat transfer away from the high heat flux area through an evaporation/condensation cycle.

6. The apparatus of claim 3, further comprising:

a pump being in fluid communication with the die microchannels, to at least facilitate fluid motion through the die microchannels.

7. The apparatus of claim 6, wherein the pump comprises an electrokinetic pump.

8. The apparatus of claim 6, wherein:

the pump is disposed within the substrate, and the substrate microchannels being in fluid communication with the die microchannels.

9. The apparatus of claim 8, wherein the pump comprises an electrokinetic pump including a fluid;

a reservoir in fluid communication with the substrate microchannels; and a plurality of electrodes adapted to provide a pressure differential by electrolysis of the fluid.

10. The apparatus of claim 3, wherein the substrate comprises an integrated heat spreader.

11. A method of heat transfer comprising:

operating a microelectronic die resulting in a high heat flux area;

transferring, at least a portion of the heat from the high heat flux area to a low heat flux area in a substrate by flowing a fluid through internal die microchannels disposed within the microelectronic die;

and through substrate microchannels in fluid communication with informal die microchannels.

12. The method of claim 11, wherein the flowing of the fluid is at least facilitated by a pressure differential created by a pump.

13. The method of claim 11, wherein the substrate includes an integrated heat spreader.

14. The method of claim 13, wherein the pump comprises an electrokinetic pump.

15. The method of claim 14, wherein the electrokinetic pump is disposed within the integrated heat spreader and includes a fluid, a plurality of electrodes, and a reservoir in fluid communication with the substrate microchannels.

16. The method of claim 15, wherein the pressure differential is at least facilitated by the electrodes providing a voltage sufficient to electrolyze the fluid.

* * * * *